(12) United States Patent
Karlin et al.

(10) Patent No.: US 8,455,286 B2
(45) Date of Patent: Jun. 4, 2013

(54) METHOD OF MAKING A MICRO-ELECTRO-MECHANICAL-SYSTEMS (MEMS) DEVICE

(75) Inventors: Lisa H. Karlin, Chandler, AZ (US); David W. Kierst, Austin, TX (US); Lianjun Liu, Chandler, AZ (US); Wei Liu, Chandler, AZ (US); Ruben B. Montez, Cedar Park, TX (US); Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 84 days.

(21) Appl. No.: 12/916,395

(22) Filed: Oct. 29, 2010

(65) Prior Publication Data

US 2012/0107993 A1    May 3, 2012

(51) Int. Cl.
     *H01L 21/00*    (2006.01)
(52) U.S. Cl.
     USPC ............. 438/50; 438/48; 438/51; 438/107; 257/E21.215; 257/E29.324
(58) Field of Classification Search
     USPC ............. 438/50, 51, 107, 149; 257/414, 419, 257/E21.456, E21.499, E27.006, E27.111
     See application file for complete search history.

(56) References Cited

U.S. PATENT DOCUMENTS

| | | | |
|---|---|---|---|
| 5,930,664 | A | 7/1999 | Hsu et al. |
| 6,006,764 | A | 12/1999 | Chu et al. |
| 6,221,752 | B1 | 4/2001 | Chou et al. |
| 7,585,754 | B2 | 9/2009 | Lo et al. |
| 7,682,860 | B2 | 3/2010 | Ouellet et al. |
| 2005/0157376 | A1* | 7/2005 | Huibers et al. ............... 359/291 |
| 2006/0019420 | A1* | 1/2006 | Liao et al. ....................... 438/51 |
| 2011/0003421 | A1* | 1/2011 | Kumar et al. ................... 438/48 |

\* cited by examiner

*Primary Examiner* — Charles Garber
*Assistant Examiner* — Abdulfattah Mustapha
(74) *Attorney, Agent, or Firm* — James L. Clingan, Jr.

(57) ABSTRACT

A method of forming a MEMS device includes forming a sacrificial layer over a substrate. The method further includes forming a metal layer over the sacrificial layer and forming a protection layer overlying the metal layer. The method further includes etching the protection layer and the metal layer to form a structure having a remaining portion of the protection layer formed over a remaining portion of the metal layer. The method further includes etching the sacrificial layer to form a movable portion of the MEMS device, wherein the remaining portion of the protection layer protects the remaining portion of the metal layer during the etching of the sacrificial layer to form the movable portion of the MEMS device.

13 Claims, 11 Drawing Sheets

METHOD OF MAKING A MICRO-ELECTRO-MECHANICAL-SYSTEMS (MEMS) DEVICE

BACKGROUND

1. Field

This disclosure relates generally to MEMS devices, and more specifically, to methods of making MEMS devices.

2. Related Art

Micro-electro-mechanical-systems (MEMS) devices are finding more and more uses, especially for spatial sensing uses such accelerometers, position detectors, and gyroscopes. These functions are becoming more and more common and finding uses in many consumers devices such as mobile phones, automobiles, and electronic games. As the uses increase the demand for lower cost also increases which bears on having manufacturing processes that provide sufficient quality at high volume. One of the things that is typically involved with a MEMS device is a portion that has some freedom of movement, often in 3 axes. The manufacturing of this portion is critical to the functionality of the MEMS device. Integrating this key process with other features that must also be present presents difficulties.

Accordingly, there is a need to improve upon processes for making a MEMS device particularly as it bears on providing a feature that has some level of freedom of motion.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a micro-electro-mechanical-systems (MEMS) device is made using an etch that provides freedom of motion of a polysilicon member while protecting a contact pad from the etchants used to perform the etch that provides the freedom of motion. The protection is achieved by depositing a sacrificial layer and patterning it to leave a portion over the location of the contact pad. The etch tends to leave a layer on the contact pad, if it is unprotected, that makes it difficult to adhere a wire bond or other contacting material. The etch is very significant to the freedom of motion and thus is very important to control in order to achieve the needed performance of the MEMS device. The remaining portion of the sacrificial layer is removed after the etch to make the contact available for contacting. This is better understood by reference to the drawings and the following specification.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
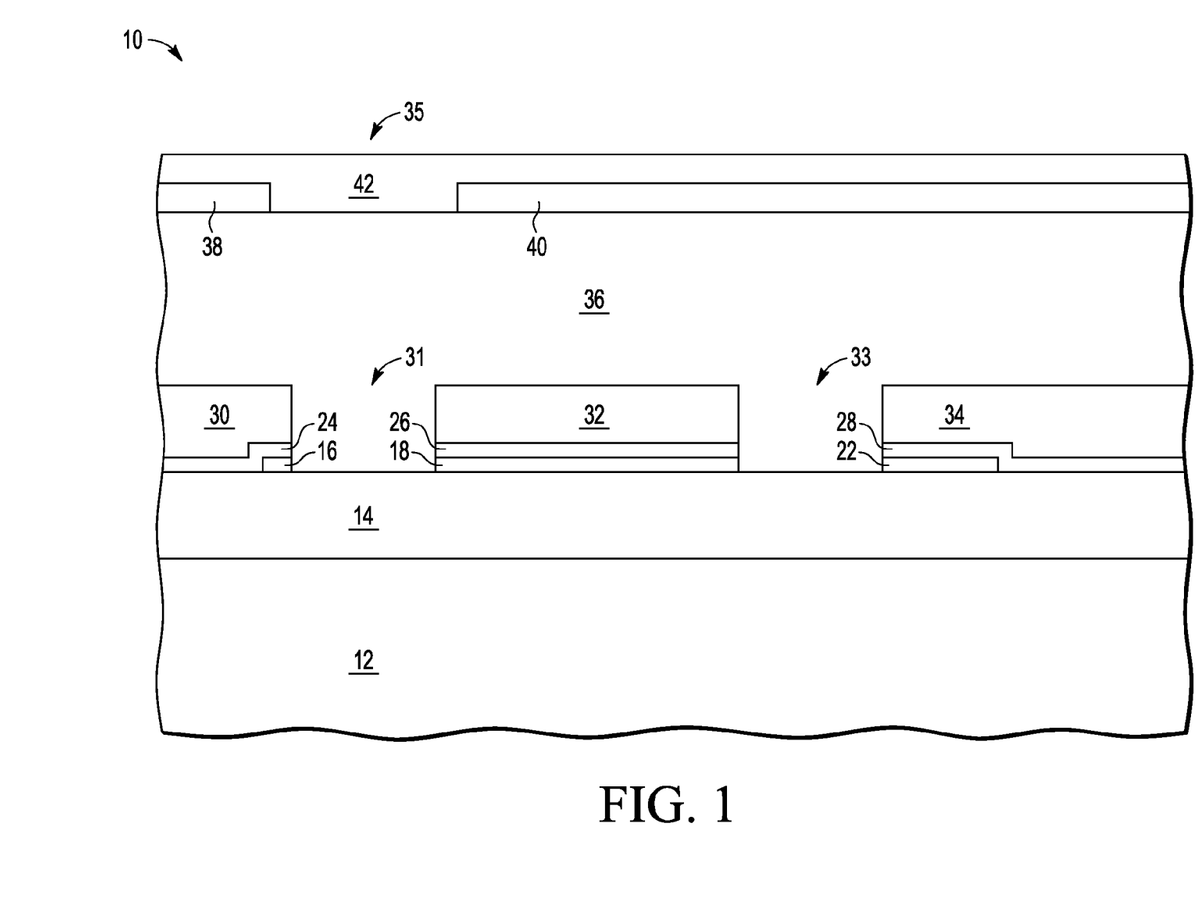
FIG. 1 is a cross section of a MEMS device at a stage in processing according to a first embodiment.

Shown in FIG. 1 is a MEMS device 10 comprising a substrate 12; a thermal oxide layer 14 grown on substrate 14; a patterned polysilicon layer having polysilicon portions 16 18, and 22; a silicon nitride layer on polysilicon portions 16, 18, and 22 and on thermal oxide layer 14 having nitride portion 24 on polysilicon portion 16 and thermal oxide layer 14, nitride portion 26 on polysilicon portion 18, and nitride portion 28 on polysilicon portion 22 and thermal oxide layer 14; a deposited oxide layer having an oxide portion 30 on nitride portion 24, an oxide portion 32 on nitride portion 26, and an oxide portion 34 on nitride portion 28; a polysilicon layer 36 over oxide portions 30, 32, and 34 and thermal oxide layer 14; a deposited oxide layer over polysilicon layer 36 having an oxide portion 38 and an oxide portion 40; and a metal layer 42 over deposited oxide layer 40 and polysilicon layer 36. A region 31 of polysilicon layer 36 is between oxide portions 30 and 32, between nitride portions 24 and 26, and between polysilicon portions 16 and 18. A region 33 of polysilicon layer 36 is between oxide portions 32 and 34, between nitride portions 26 and 28, and between polysilicon portions 18 and 22. A region 35 of metal layer is between oxide portions 38 and 40. Effective thicknesses for the various layers are as follows: 2.5 microns for thermal oxide 14; 0.35 micron for polysilicon portions 16, 18, and 22; 0.3 micron for nitride portions 24, 26, and 28; 1.8 microns for oxide portions 30, 32, and 34; 25 microns for polysilicon layer 36; 0.4 micron for oxide portions 38 and 40; and 1.4 microns for metal layer 35. Other dimensions will work as well. Metal layer 42 may comprise aluminum and may include other materials as well such as copper and silicon. Oxide portions 30, 32, and 34 are preferably deposited using tetraethylorthosilicate (TEOS) but other techniques may also be effective. The various polysilicon layers may be doped. Polysilicon portion 18 should be conductive so if polysilicon is chosen for this purpose it should be doped.

Figure 2:
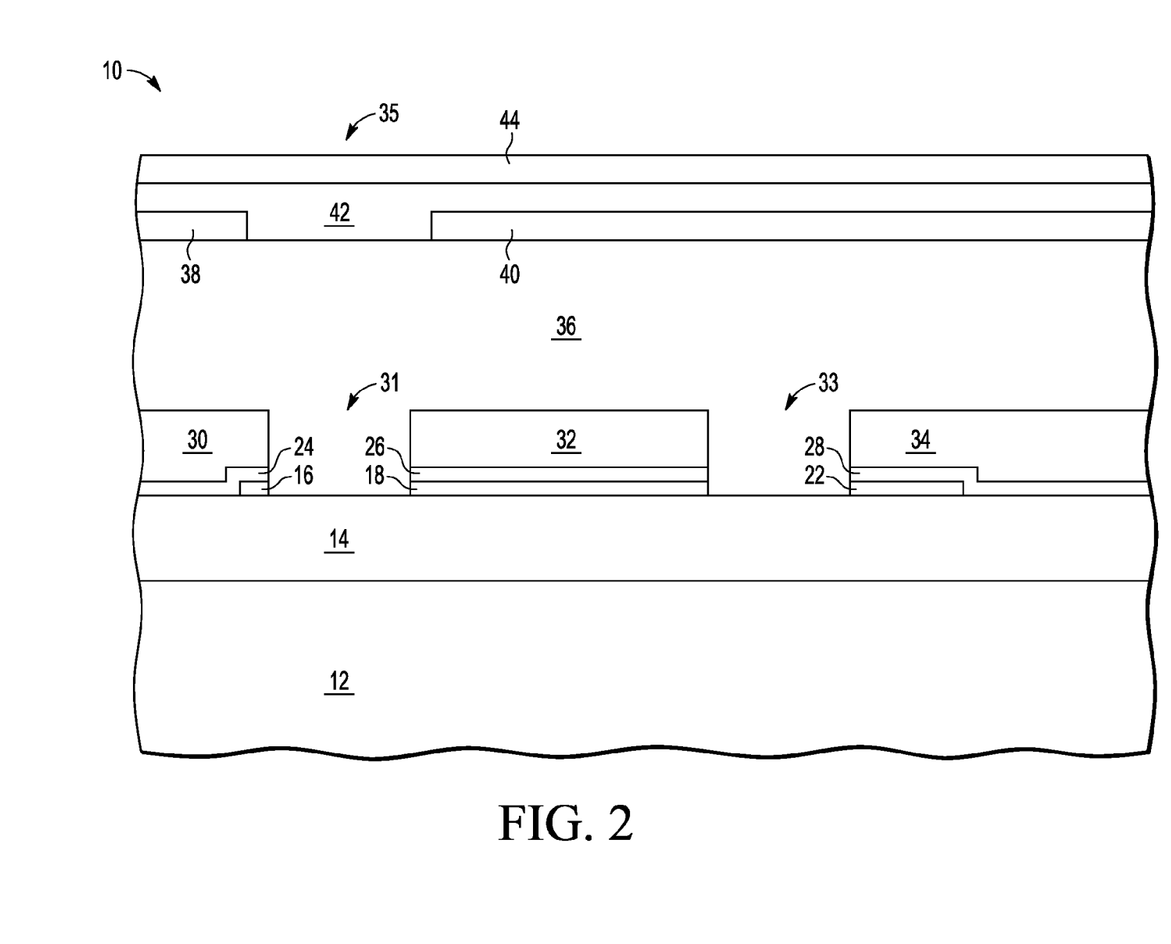
FIG. 2 is a cross section of the MEMS device of FIG. 1 at a subsequent stage in processing.

Shown in FIG. 2 is MEMS device 10 after depositing a silicon-rich silicon nitride (SiRN) layer 44 that may have a thickness of 0.75 micron. SiRN layer 44 may have refractive index of 2.19. Other relative concentrations of silicon resulting in a lower or higher refractive index may also be effective. Stoichemetric silicon nitride has about a 2.02 refractive index. Thus it is desirable that the refractive index exceed 2.02. SiRN is preferable to stoichemetric silicon nitride because, for hydrofluoric acid (HF) in vapor form, silicon-rich silicon nitride etches more slowly. Although SiRN is the preferred material, other materials may also be effective for layer 44. Exemplary materials are titanium nitride, titanium, and amorphous carbide. Other materials may also be effective. As noted by the examples, layer 44 may be a conductor or a dielectric.

Figure 3:
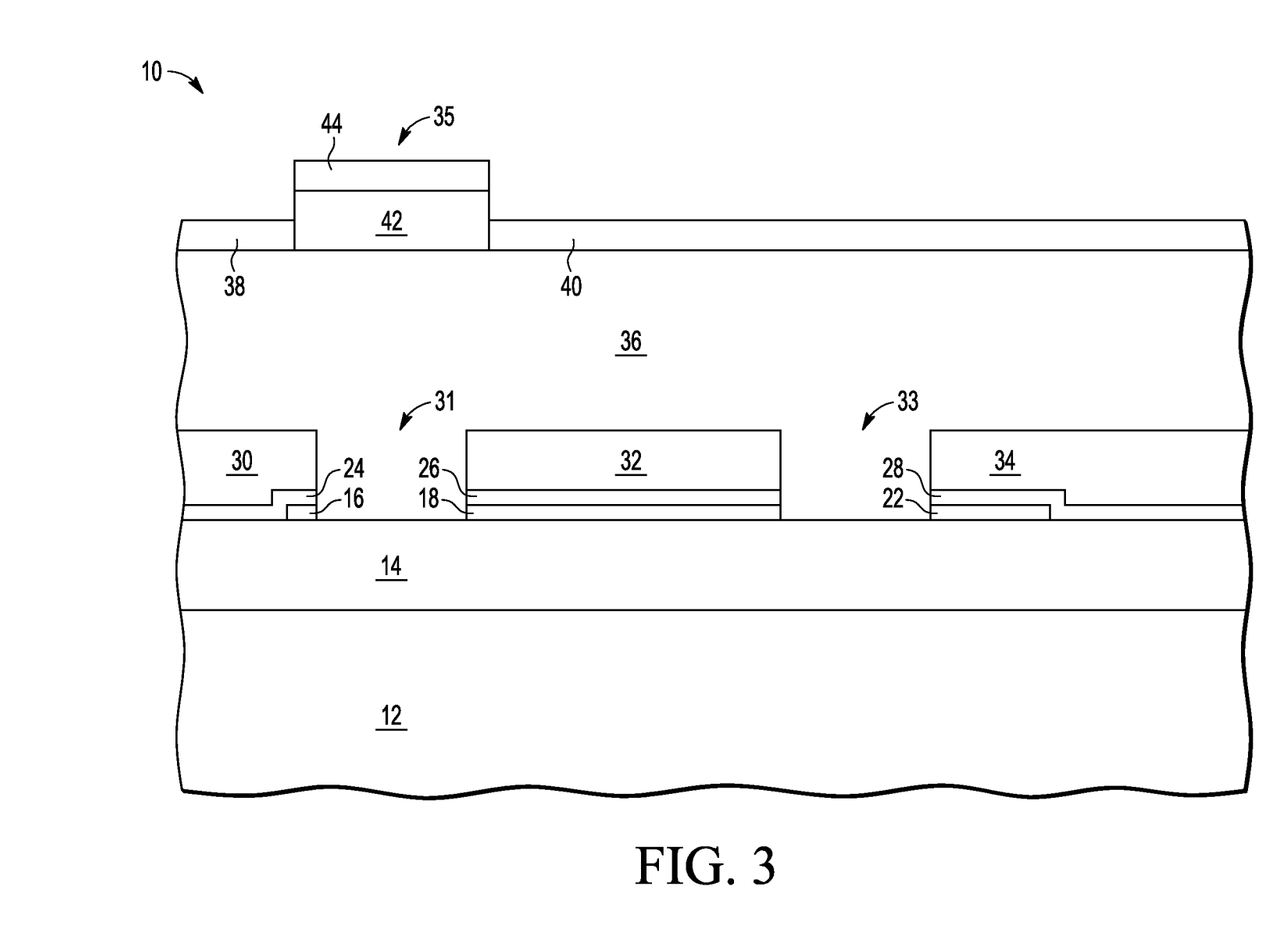
FIG. 3 is a cross section of the MEMS device of FIG. 2 at a subsequent stage in processing.

Shown in FIG. 3 is MEMS device 10 after performing a patterned etch of metal layer 42 and SiRN layer 44 aligned to region 35 and thus leaving region 35 of metal layer 42 and the portion of SiRN layer 44 aligned to region 31.

Figure 4:
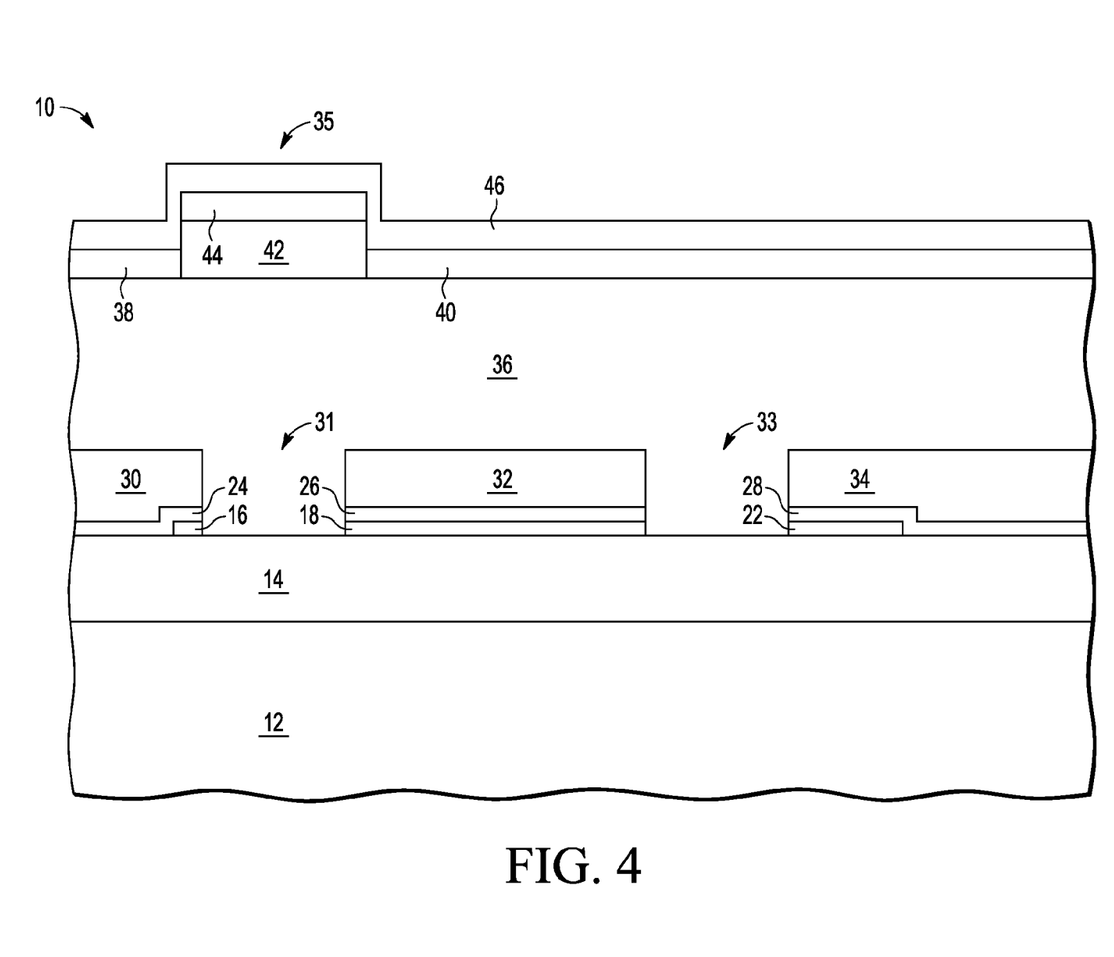
FIG. 4 is a cross section of the MEMS device of FIG. 3 at a subsequent stage in processing.

Shown in FIG. 4 is MEMS device 10 after depositing a layer 46 of oxide having a thickness that may be 0.4 micron.

Figure 5:
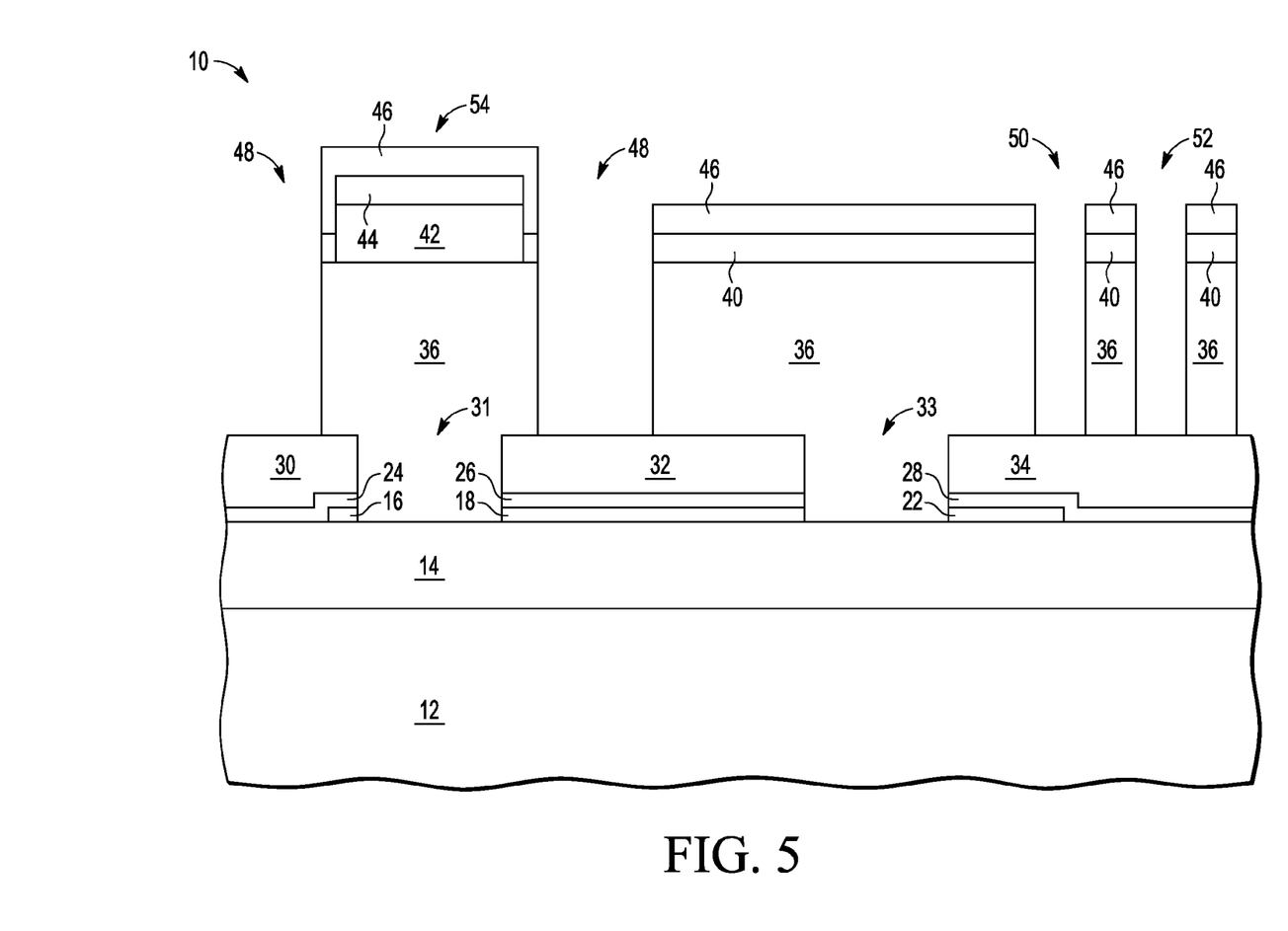
FIG. 5 is a cross section of the MEMS device of FIG. 4 at a subsequent stage in processing.

Shown in FIG. 5 is MEMS device 10 after etching openings 48, 50, and 52 through oxide layer 46, oxide layer 40, and polysilicon layer 36 to expose portions of oxide portions 30, 32, and 34. Opening 48 surrounds a contact stack 54. Openings 50 and 52 are such that the portions of polysilicon layer 36 adjacent to openings 50 and 52 remain as part of a continuous portion of polysilicon layer 36. This will be the movable member of the MEMS device which may also be called the movable portion of the MEMS device.

Figure 6:
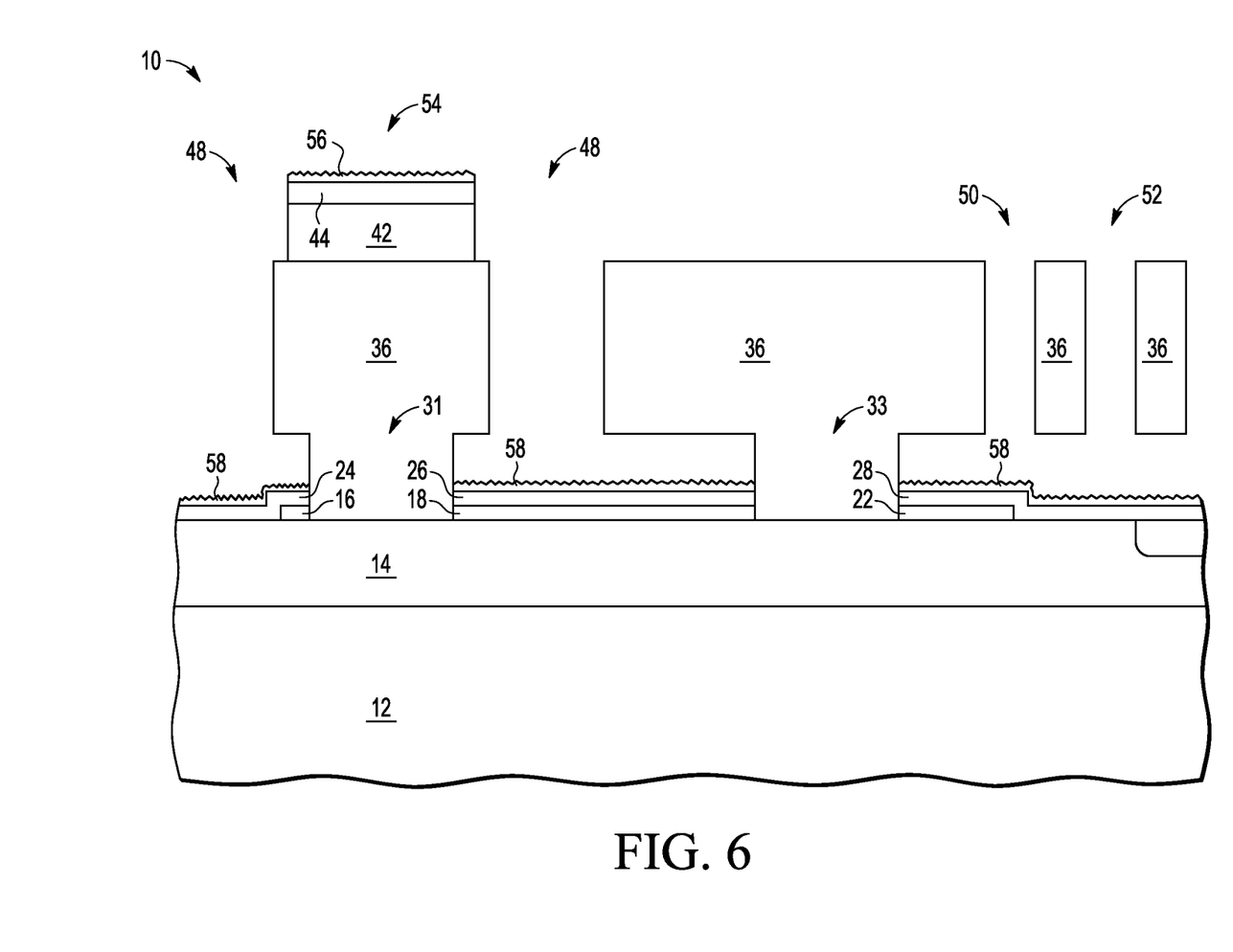
FIG. 6 is a cross section of the MEMS device of FIG. 5 at a subsequent stage in processing.

Shown in FIG. 6 is MEMS device after an oxide etch using vapor phase HF which removes oxide portions 30, 32, and 34 as well as oxide layers 46 and 40. Oxide portions 30, 32, and 34 may be considered sacrificial. SiRN layer 44 functions as an etch stop so that metal layer 42 does not receive the HF etch and is thus a protection layer as it protects metal layer 42. SiRN layer 44 is also etched but the vapor phase HF etch is tuned so that the oxide is etched much faster than SiRN. A consequence of this etch is residue 58 on nitride portions 24, 26, and 28 and a residue 56 on SiRN layer 44. The removal of oxide portions 32 and 34 has the effect of releasing the movable member portion of polysilicon layer 36 to be movable. Thus, the etch of oxide that has this effect in a MEMS device is sometimes called a release etch. Region 33 functions as a base for the movable member portion of polysilicon layer 36. At region 31 the portion of polysilicon layer 36 that is part of contact stack 54 makes contact to polysilicon portion 18 which in turn contacts the movable member at region 33. The HF etch, if it contacts metal layer 42, has been found to form a layer that is a compound comprising oxygen, aluminum, and fluorine. This compound makes it difficult to form a good electrical contact to metal layer 42. For example, gold does not adhere well to this compound. Further this compound is not easily removed. Residue 56 is also not good for forming electrical contact but residue is easily removed using techniques commonly used for cleaning after performing an etch. For example a rinse in hydrogen peroxide followed by a 350 degree Celsius bake is effective and which also is effective in removing residue 58. Vapor phase HF processes may include tools wherein either an anhydrous HF liquid mixture is evaporated to form HF vapor or gaseous nitrogen is bubbled through a highly concentrated solution of HF and water. An effective process diluent is nitrogen gas. Gaseous isopropyl alcohol or similar hydrophobic compounds may be also added to the process in order to promote effective drying of the MEMS device. Processing chambers may operate at atmospheric pressure or at sub-atmospheric pressures. The temperature of the reaction may be held at room temperature or be performed at elevated temperatures (25-50 deg C.). Further the process parameters are adjustable to achieve different rates for SiRN compared to deposited oxide. For example, the rate of oxide etching can be more than four times that of SiRN. This allows for flexibility in selecting the thickness of the SiRN layer.

Hydrogen fluoride (HF) is an effective method for etching silicon dioxide, a common sacrificial material used in MEMS processing. However, this etch in aqueous form may attack aluminum, particularly due to the presence of water. The use of vapor phase HF to etch oxide reduces the attack of aluminum during the etch. However, water vapor liberated by the etch of silicon dioxide can condense on the aluminum and result in the formation of undesirable compounds of aluminum, fluorine and oxygen.

Figure 7:
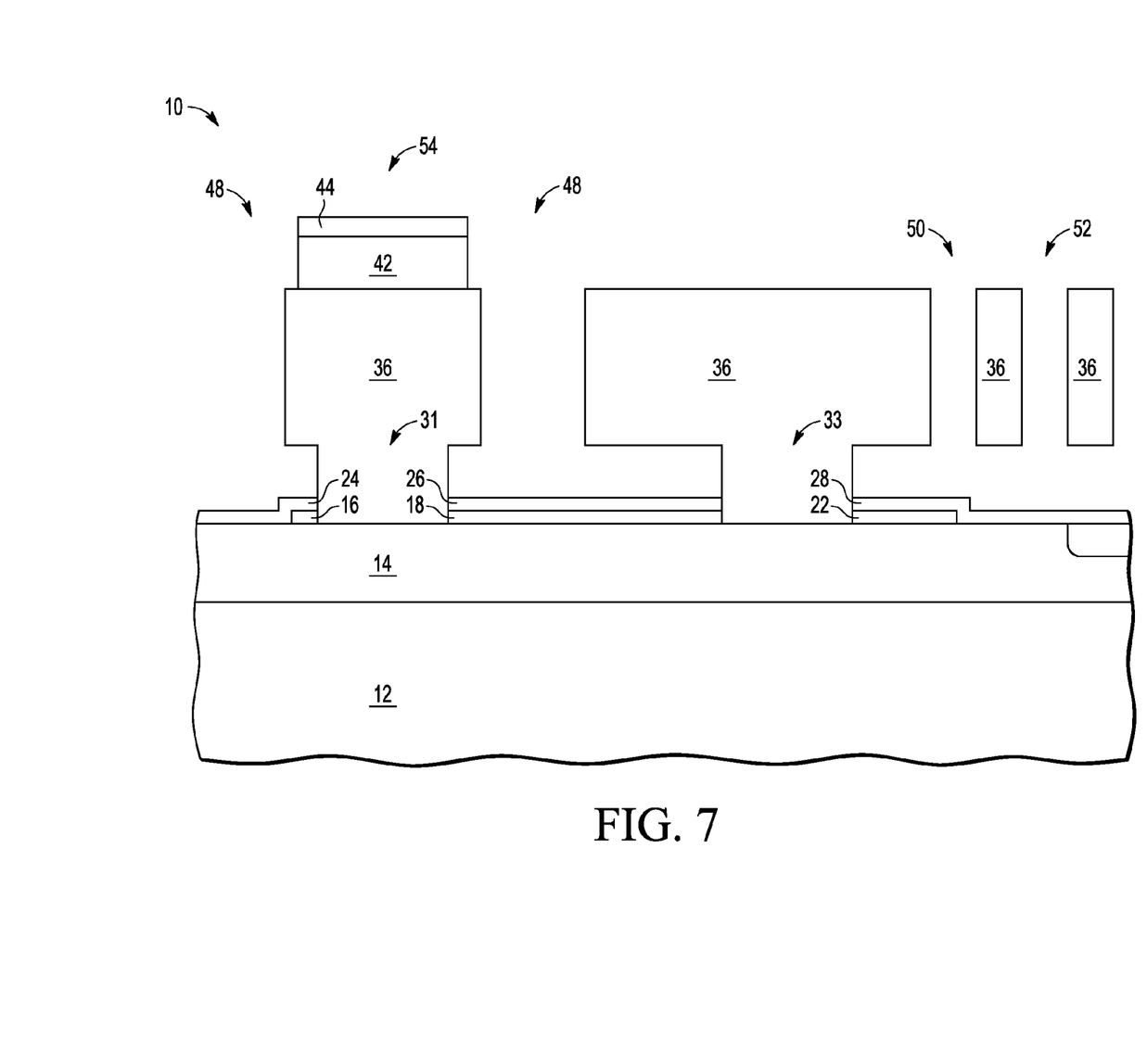
FIG. 7 is a cross section of the MEMS device of FIG. 6 at a subsequent stage in processing.

Shown in FIG. 7 is MEMS device 10 after performing the rinse and bake to remove residue 56 and residue 58.

Figure 8:
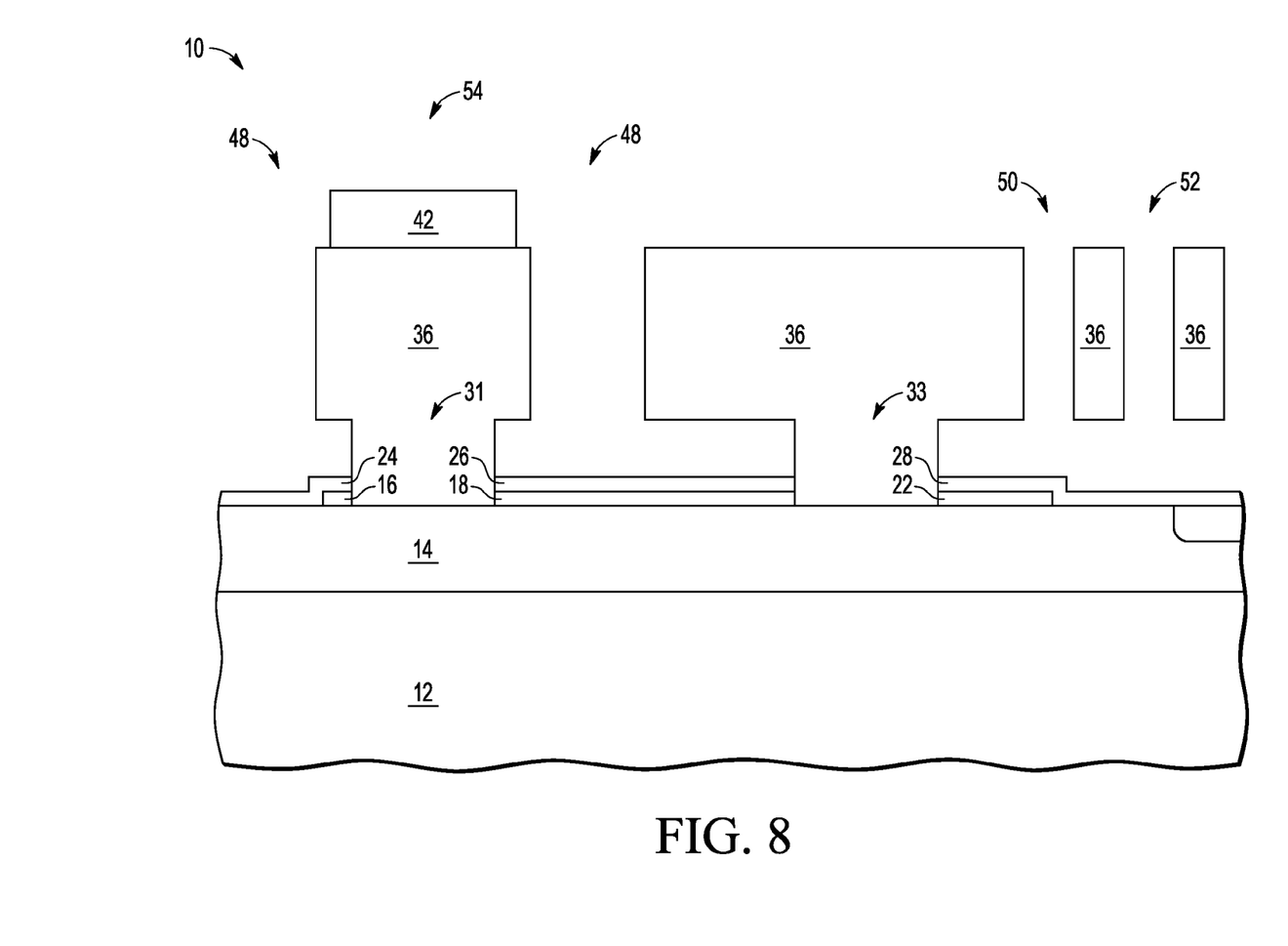
FIG. 8 is a cross section of the MEMS device of FIG. 7 at a subsequent stage in processing.

Shown in FIG. 8 is MEMS device 10 after removing nitride portions 24, 26, and 28 and nitride layer 44. This exposes the top surface of metal layer 42 of contact stack 54. This leaves a completed MEMS device which can be subsequently packaged in conventional fashion and contacting metal layer 42. This removal may occur by using a dry plasma etch that is selective between nitride and polysilicon.

Figure 9:
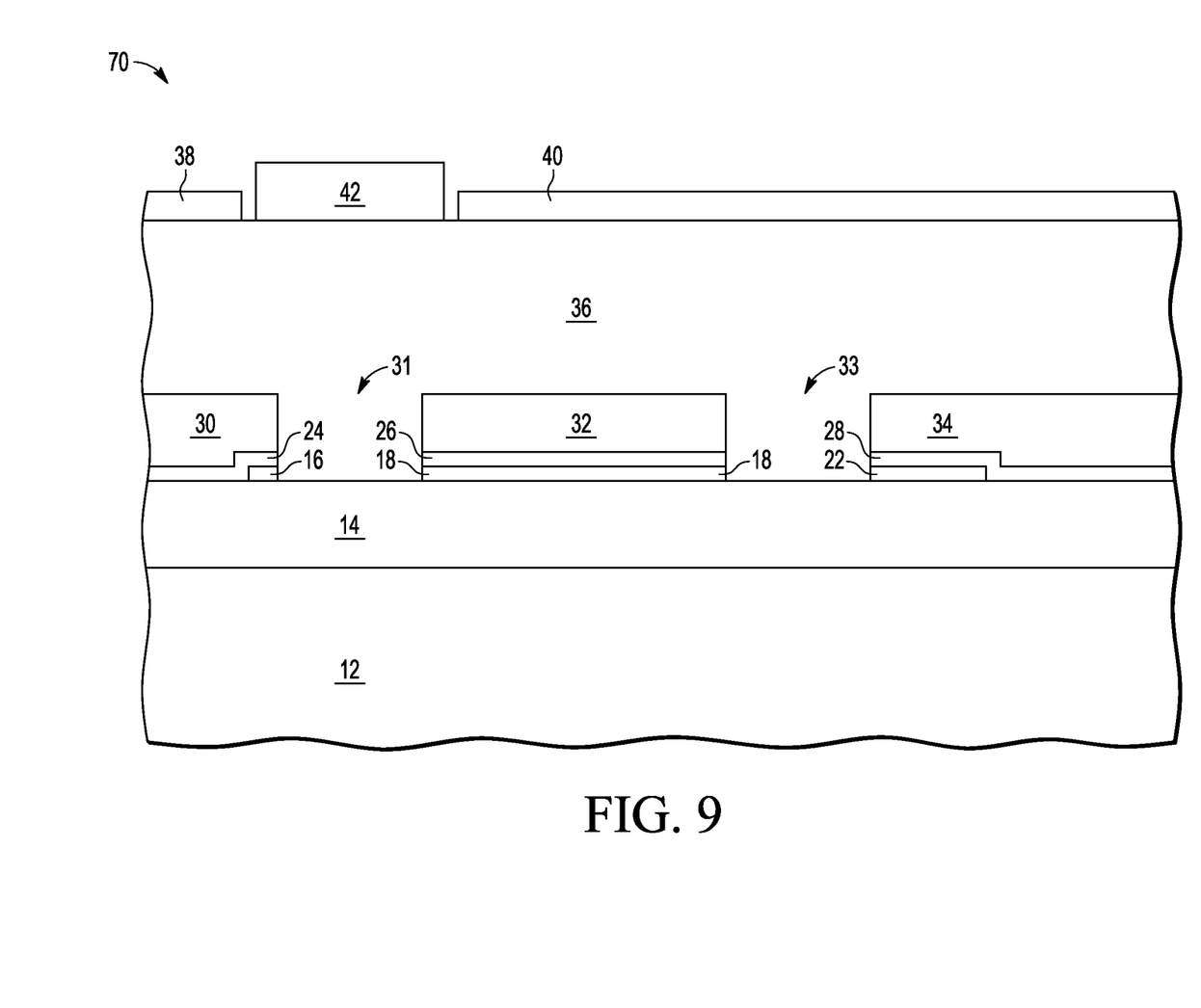
FIG. 9 is a cross section of a MEMS device at a stage in processing according to a second embodiment.

Shown in FIG. 9, as an alternative to the embodiment of FIGS. 2-8, is a MEMS device 70 that is MEMS device 10 of FIG. 1 after performing a patterned etch of layer 42 instead of depositing a layer of SiRN as shown in FIG. 2. This leaves a portion of metal layer 42 in the opening in layer 40. In this example, there is a small space between the remaining portion of layer 42 and layer 40 so that a small portion of polysilicon layer 36 is exposed.

Figure 10:
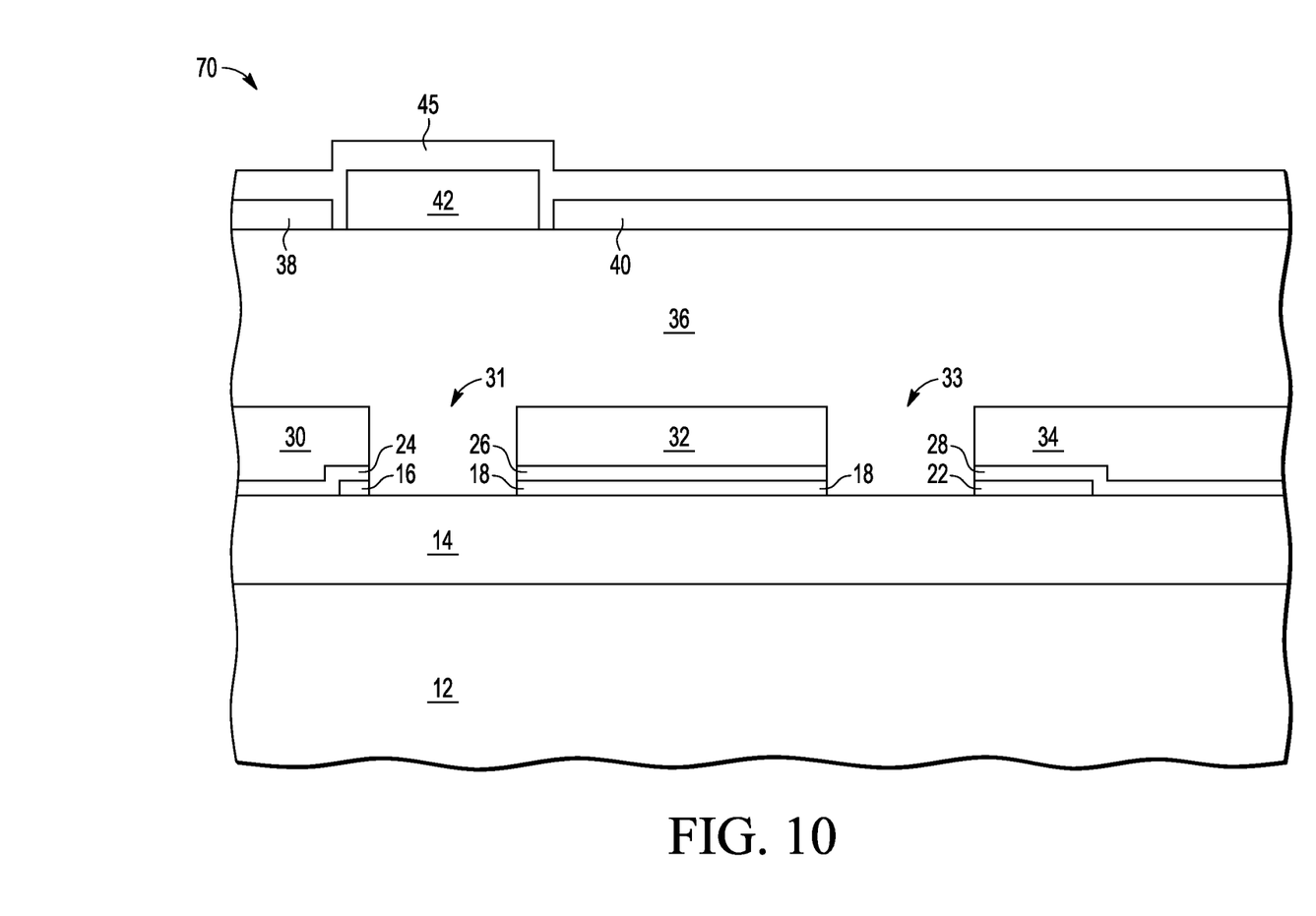
FIG. 10 is a cross section of the MEMS device of FIG. 9 at a subsequent stage in processing.

Shown in FIG. 10 is MEMS device 70 after depositing a layer 45 of SiRN over the remaining portion of layer 42, the small portion of exposed polysilicon layer 36, and layer 40.

Figure 11:
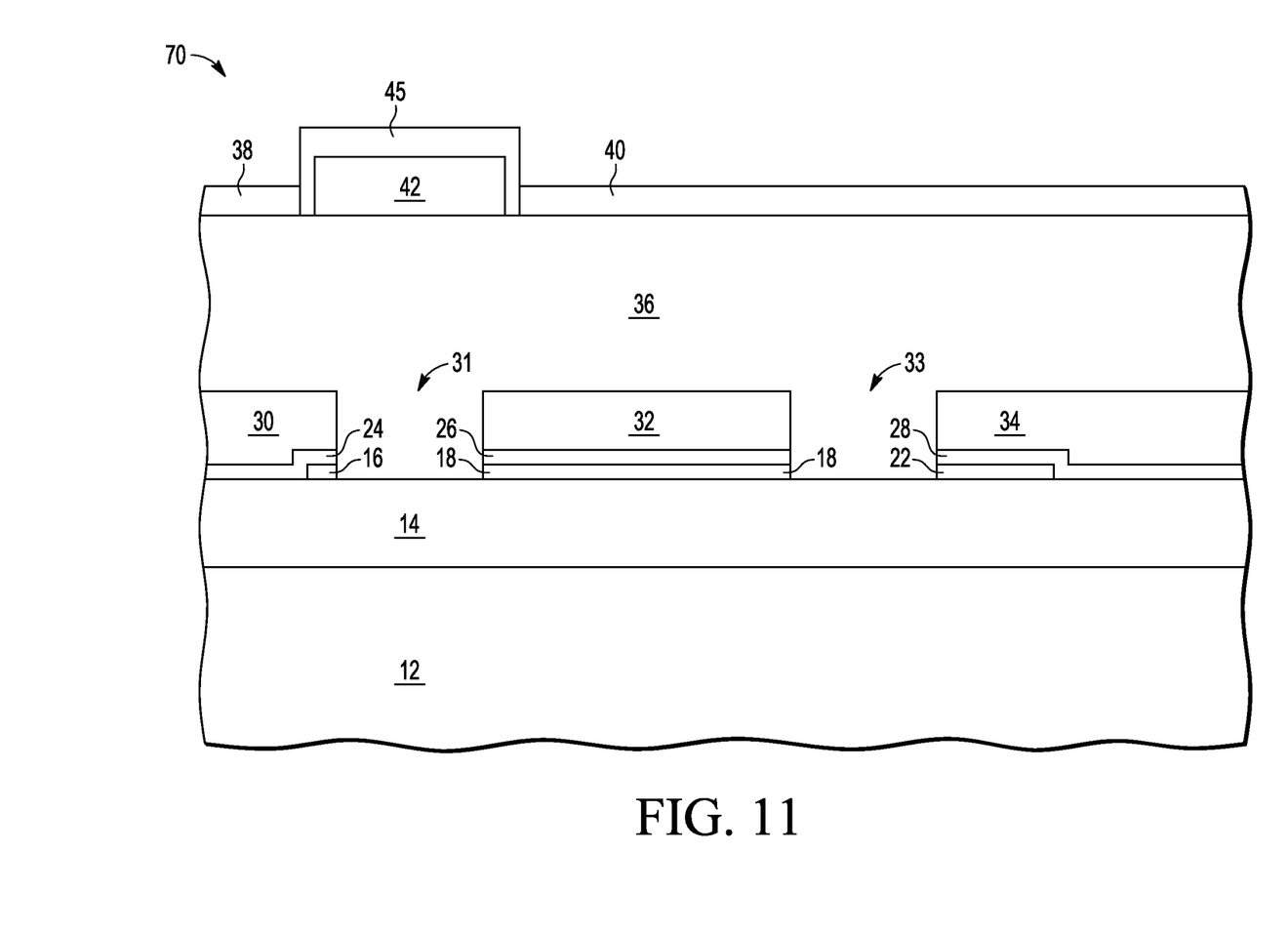
FIG. 11 is a cross section of the MEMS device of FIG. 10 at a subsequent stage in processing.

Shown in FIG. 11 is MEMS device 70 after performing a patterned etch of layer 45 of SiRN which leaves SiRN on the sidewalls of the remaining portion of layer 42. This avoids the vapor phase HF etch from contacting any portion, even the sidewalls, of the remaining portion of layer 42. The covering the sidewalls is the primary difference from MEMS device 10 of FIG. 3.

MEMS device 70 of FIG. 11 is then processed as described for MEMS device 10 in FIGS. 4-8.

Thus, it is seen that providing a protective layer, preferably of SiRN, to protect the contact during the etch that removes the oxide that has the effect of giving the freedom of motion to the movable member made up of the polysilicon portions that remain as a continuous structural element. This etch that removes the oxide is very important in the predictable operation of the movable element. A vapor phase HF etch has been found to be very effective for this purpose. Due to the adverse effect of this etch on the contact, a sacrificial protective layer has been employed to be effective in avoiding the problem of contaminating the contact. Also the HF etch as been tuned so that the thickness of the sacrificial protective layer need not be excessive in achieving the desired etch stop over the contact.

By now it should be appreciated that there has been provided a method of forming a MEMS device. The method includes forming a sacrificial layer over a substrate. The method further includes forming a metal layer over the sacrificial layer. The method further includes forming a protection layer overlying the metal layer. The method further includes etching the protection layer and the metal layer to form a structure having a remaining portion of the protection layer formed over a remaining portion of the metal layer. The method further includes etching the sacrificial layer to form a movable portion of the MEMS device, wherein the remaining portion of the protection layer protects the remaining portion of the metal layer during the etching of the sacrificial layer to form the movable portion of the MEMS device. The method may have a further characterization by which a material used to form the protection layer and a thickness of the protection layer are selected such that after the step of the etching the sacrificial layer to form the movable portion of the MEMS device, a residual portion of the remaining portion of the protection layer remains over the remaining portion of the metal layer. The method may further comprise after etching the protection layer and the metal layer to form the structure, forming an insulating layer overlying the remaining portion of the protection layer. The method may have a further characterization by which the structure comprises a bond pad structure. The method may further comprise forming a conductive layer over the sacrificial layer and prior to etching the sacrificial layer to form the movable portion of the MEMS device, etching the conductive layer to form a feature of the movable portion. The method may have a further characterization by which the protection layer comprises one of a group consisting of silicon rich silicon nitride, titanium nitride, titanium and amorphous carbide. The method may have a further characterization by which the protection layer comprises silicon rich silicon nitride.

Also described is a method of forming a MEMS device. The method includes forming a sacrificial layer over a substrate. The method further includes forming a metal layer over the sacrificial layer. The method further includes etching the metal layer to form a structure having a remaining portion of the metal layer. The method further includes forming a protection layer overlying at least the remaining portion of the metal layer. The method further includes etching the sacrificial layer to form a movable portion of the MEMS device, wherein the protection layer protects the remaining portion of the metal layer during the etching of the sacrificial layer to form the movable portion of the MEMS device. The method may have a further characterization by which a material used to form the protection layer and a thickness of the protection layer are selected such that after the step of the etching the sacrificial layer to form the movable portion of the MEMS device, a residual portion of the remaining portion of the sacrificial layer remains over the remaining portion of the metal layer. The method may further comprise prior to etching the protection layer, forming an insulating layer overlying the protection layer. The method may have a further characterization by which structure comprises a bond pad structure. The method may further comprise forming a conductive layer over the sacrificial layer and prior to etching the sacrificial layer to form the movable portion of the MEMS device, etching the conductive layer to form a feature of the movable portion. The method may have a further characterization by which the protection layer comprises one of a group consisting of silicon-rich silicon nitride, titanium nitride, titanium, and amorphous carbide. The method may have a further characterization by which the protection layer comprises silicon-rich silicon nitride.

Described also is a method of forming a MEMS device. The method includes forming a sacrificial layer over a substrate. The method further includes forming a metal layer over the sacrificial layer. The method includes forming a protection layer overlying the metal layer. The method further includes etching the protection layer and the metal layer to form a bond pad structure having a remaining portion of the protection layer formed over a remaining portion of the metal layer. The method further includes forming an insulating layer overlying at least the remaining portion of the protection layer. The method further includes etching the sacrificial layer to form a movable portion of the MEMS device, wherein the remaining portion of the protection layer protects at least a top surface of the remaining portion of the metal layer, forming the bond pad structure, from contamination during the step of etching the sacrificial layer to form the movable portion of the MEMS device. The method may have a further characterization by which a material used to form the protection layer and a thickness of the protection layer are selected such that after the step of the etching the sacrificial layer to form the movable portion of the MEMS device, a residual portion of the remaining portion of the sacrificial layer remains over the remaining portion of the metal layer. The method may further comprise forming a conductive layer over the sacrificial layer and prior to etching the sacrificial layer to form the movable portion of the MEMS device, etching the conductive layer to form a feature of the movable portion. The method may have a further characterization by which the protection layer is selected from a group consisting of silicon nitride and titanium nitride. The method may have a further characterization by which the protection layer comprises silicon-rich nitride. The method may have a further characterization by which the protection layer comprises one of a group consisting of silicon-rich silicon nitride, titanium nitride, titanium, and amorphous carbide.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, another etch may be found to be effective as a release etch and still may result in deleterious effects on the contact and may benefit from using the sacrificial protective layer. Also described is that the polysilicon layer is patterned after the contact metal is patterned but the reverse may be the case in which polysilicon layer 36 would be patterned for shaping the movable member and then metal layer 42 would be patterned to from the contact. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a MEMS device, the method comprising:

forming a sacrificial layer of oxide over a substrate;
    forming a polysilicon layer over the sacrificial layer;
    forming a metal layer over the polysilicon layer;
    forming a protection layer overlying the metal layer;
    etching the protection layer and the metal layer to form a contact stack structure having a remaining portion of the protection layer formed over a remaining portion of the metal layer;
    forming a layer of oxide over the contact stack structure and the polysilicon layer;
    patterning the and the layer of oxide and the polysilicon layer to form a structure of the MEMS device from the polysilicion layer and to leave a portion of the layer of oxide;

etching the sacrificial layer to result in the structure of the MEMS device being movable, wherein portion of the layer of oxide is removed leaving a residue on the remaining portion of the protection layer, wherein the remaining portion of the protection layer protects the remaining portion of the metal layer during the etching of the sacrificial layer;

removing the residue; and removing the remaining portion of the protection layer.

2. The method of claim 1, wherein the contact stack structure comprises a bond pad structure.

3. The method of claim 1, wherein the protection layer comprises one of a group consisting of silicon-rich silicon nitride, titanium nitride, titanium, amorphous carbide.

4. The method of claim 1, wherein the protection layer comprises silicon-rich silicon nitride.

5. A method of forming a MEMS device, the method comprising:

forming a sacrificial layer of a first material over a substrate;

patterning the sacrificial layer to form a patterned sacrificial layer;

forming a polysilicon layer over the patterned sacrificial layer;

forming a metal layer over the sacrificial layer;

pattern etching the metal layer to form a contact structure on the polysilicon layer;

forming a protection layer overlying at least the remaining portion of the metal layer;

forming an overlying layer of the first material over the contact structure, the protective layer, and the polysilicon layer;

pattern etching the overlying layer of the first material and the polysilicon layer to form a MEMS structure of the polysilicon layer and a patterned overlying layer;

etching the patterned sacrificial layer to form a movable portion of the MEMS structure, wherein the patterned overlying layer is removed and the protection layer protects the remaining portion of the metal layer during the etching of the patterned sacrificial layer to form the movable portion of the MEMS device; and removing the protection layer.

6. The method of claim 5, wherein the structure comprises a bond pad structure.

7. The method of claim 5, wherein the protection layer comprises one of a group consisting of silicon-rich silicon nitride, titanium nitride, titanium, and amorphous carbide.

8. The method of claim 5, wherein the protection layer comprises silicon-rich nitride.

9. A method of forming a MEMS device, the method comprising:

forming a patterned sacrificial layer of a first material over a substrate;

forming a polysilicon layer over the substrate including over the patterned sacrificial layer;

forming a metal contact on the polysilicon layer with an protection layer overlying the metal contact;

forming an insulating layer of the first material overlying the metal contact on the polysilicon layer with the protection layer and overlying the polysilicon layer;

pattern etching the insulating layer and the polysilicon layer to form a MEMS structure;

etching the patterned sacrificial layer to form a movable portion of the MEMS structure, the protection layer protects at least a top surface of the remaining portion of the metal contact from contamination during the step of etching the sacrificial layer to form the movable portion of the MEMS device; and removing the protection layer.

10. The method of claim 9, wherein the first material comprises oxide.

11. The method of claim 9, wherein the protection layer is selected from a group consisting of silicon nitride and titanium nitride.

12. The method of claim 1, wherein the protection layer comprises silicon-rich nitride.

13. The method of claim 10, wherein the protection layer comprises one of a group consisting of silicon-rich silicon nitride, titanium nitride, titanium, and amorphous carbide.

* * * * *

UNITED STATES PATENT AND TRADEMARK OFFICE
CERTIFICATE OF CORRECTION

PATENT NO. : 8,455,286 B2
APPLICATION NO. : 12/916395
DATED : June 4, 2013
INVENTOR(S) : Lisa H. Karlin et al.

Page 1 of 1

It is certified that error appears in the above-identified patent and that said Letters Patent is hereby corrected as shown below:

In the Claims

At column 6, line 64, claim 1, please correct "patterning the and the layer" to be --patterning the layer--

Signed and Sealed this
First Day of April, 2014

Michelle K. Lee
*Deputy Director of the United States Patent and Trademark Office*